United States Patent [19]

Sone

[11] Patent Number: 4,806,790
[45] Date of Patent: Feb. 21, 1989

[54] SAMPLE-AND-HOLD CIRCUIT

[75] Inventor: Kazuya Sone, Tokyo, Japan

[73] Assignee: NEC Corporation, Japan

[21] Appl. No.: 155,251

[22] Filed: Feb. 12, 1988

[30] Foreign Application Priority Data

Feb. 16, 1987 [JP] Japan .................................. 62-33001
Apr. 21, 1987 [JP] Japan .................................. 62-99404

[51] Int. Cl.$^4$ ............................................. G11C 27/02
[52] U.S. Cl. ..................................... 307/353; 307/551
[58] Field of Search ............... 307/352, 353, 549, 551, 307/561, 565; 328/151

[56] References Cited

U.S. PATENT DOCUMENTS 3,413,492  11/1968  Schneider ........................... 307/352
3,643,110   2/1972  Thompson ........................... 328/151
3,659,117   4/1972  Caveney et al. .................... 307/353
4,559,457  12/1985  Sugawara ............................ 307/352

Primary Examiner—John Zazworsky
Attorney, Agent, or Firm—Laff, Whitesel, Conte & Saret

[57] ABSTRACT

For elimination of a driftage of voltage at an output node, there is proposed a sampling-and-hold circuit comprising an n-p-n type charging transistor capable of charging up a hold-capacitor to a certain voltage level in proportion to the voltage level of an input signal, an n-p-n type driving transistor driven by the hold-capacitor for producing an output signal at a signal output node, and a clamping circuit operative to keep the voltage level of the base node of the charging transistor in a predetermined value is so far as the hold-capacitor keeps the certain voltage level, so that the hold-capacitor supplies a base current only to the driving transistor, thereby decreasing the driftage of voltage at the output node.

18 Claims, 3 Drawing Sheets

SAMPLE-AND-HOLD CIRCUIT

FIELD OF THE INVENTION

This invention relates to a sample-and-hold circuit and, more particularly, to a sample-and-hold circuit suitable for forming an integrated circuit fabricated on a semiconductor chip.

BACKGROUND OF THE INVENTION

In FIG. 1 of the drawings, there is shown a known sample-and-hold circuit formed between a high voltage line LH and a low voltage line LL. The known sample-and-hold circuit has a pair of input nodes 1 and 2 which are respectively supplied with a control signal SH1 and the complementary control signal SH2 different in phase from the control signal SH1 by 180 degrees. If the control signal SH1 goes up to a high voltage level VH, the complementary control signal SH2 is shifted from the high voltage level VH to a low voltage level VL. Then, n-p-n type bipolar transistors 3 and 6 turn on to provide conduction paths passing therethrough, however n-p-n type bipolar transistors 4 and 5 are turned off, thereby allowing the sample-and-hold circuit to operate in a sample mode. In the sample mode, when an input signal Sin is applied to an input node 7, an n-p-n type bipolar transistor 8 turns on to serve as an emitter follower, and a series of diodes 9, 10 and 11 serves as a level-shifting circuit for shifting down a voltage level supplied from the output node of a constant current source 12 coupled to the high voltage line LH. Through the n-p-n type bipolar transistor 3 flows the total amount of currents passing through the series of diodes 9, 10 and 11 and the conduction path of the n-p-n bipolar transistor 8, respectively, which in turn flows into a constant current source 13. The current is discharged to the low voltage line LL.

Assuming now that all of the diodes 9, 10 and 11 have respective diode forward voltages (each represented by $V_d$) approximately equal in value to one another, a voltage level $V_{b14}$ at the base node of an n-p-n type bipolar transistor 14 is calculated as follows:

$$V_{b14} = V_{in} - V_{be8} + 3V_d \quad \text{(Eq. 1)}$$

where Vin is the voltage level of the input signal Sin and $V_{be8}$ is the difference voltage or the forwardly biassing voltage between the base node and the emitter node. With the voltage level $V_{b14}$, the n-p-n type bipolar transistor 14 turns on to serve as an emitter follower, and a current is supplied from the high voltage line through the n-p-n bipolar transistor 14 to a hold-capacitor 15. Then, the hold-capacitor 15 is charged up to a voltage level $V_{c15}$ which is given by Equation 2:

$$V_{c15} = V_{in} - (V_{be8} + V_{be14}) + 3V_d \quad \text{(Eq. 2)}$$

where $V_{be14}$ is a forwardly biassing voltage between the base node and the emitter node of the n-p-n type bipolar transistor 14. As will be understood from Equation 2, the voltage level $V_{c15}$ at the hold-capacitor 15 follows the voltage level of the input signal Sin but is different from the input signal Vin by the value of $(3V_d - V_{be8} - V_{be14})$. The emitter node of the n-p-n type bipolar transistor 14 is coupled to the base node of an n-p-n type bipolar transistor 16 and the emitter node of the n-p-n type bipolar transistor 16 in turn is coupled to an output node 17, so that a voltage level Vout at the output node 17 is calculated as:

$$V_{out} = V_{in} - (V_{be8} \; 30 \; V_{be14} + V_{be16}) + 3V_d \quad \text{(Eq. 3)}$$

where $V_{be16}$ is a forwardly biassing voltage between the base node and the emitter node of the n-p-n bipolar transistor 16. If the n-p-n bipolar transistors 8, 14 and 16 and the diodes 9, 10 and 11 are selected in such a manner as to have respective device characteristics which results in that the sum of the forwardly biassing voltages $V_{be8}$, $V_{be14}$ and $V_{be16}$ is approximately equal to the sum of the respective diode forward voltages of the diodes 9, 10 and 11, it is possible that the voltage level Vout at the output node 17 is approximately equal to the voltage level of the input signal Vin. This means that an output signal Sout appearing at the output node 17 is approximately equal in voltage level to the input signal Sin in the sample mode.

On the other hand, when the control signal SH1 goes down to the low voltage level VL, the complementary control signal SH2 goes up to the high voltage level VH, thereby causing the n-p-n type bipolar transistors 4 and 5 to turn on to provide respective conduction paths. However, with the control signal SH1 of the low voltage level, the n-p-n type bipolar transistors 3 and 6 turn off to block the conduction paths, so that the voltage level at the base node of the n-p-n bipolar transistor 14 is decreased, and, for this reason, the n-p-n bipolar transistor 14 turns off, thereby completing the charging to the hold-capacitor 15. This means that the sample-and-hold circuit is shifted from the sample mode to a hold mode. In the hold mode, the hold-capacitor 15 provides the voltage level $V_{c15}$ to the base node of an n-p-n type bipolar transistor 18. The constant current source 12 provides the current through a diode 19 to the n-p-n type bipolar transistors 4 and 5, and the n-p-n type biopolar transistor 18 also provides a current from the high voltage line LH to the n-p-n bipolar transistors 4 and 5. As described hereinbefore, the n-p-n type bipolar transistors 4 and 5 are turned on in the hold mode, the currents provided to the n-p-n type bipolar transistors 4 and 5 flow into the constant current source 13 and a constant current source 20. In this situation, if the voltage level $V_{c15}$ is decreased, the n-p-n type bipolar transistor 14 slightly turns on to charge up the hold-capacitor 15. However, if the hold-capacitor 15 is charged up again, the n-p-n type bipolar transistor 14 turns off again. In this manner, the hold-capacitor 15 keeps the voltage level thereof at the constant level determined upon completion of the sample mode. Reference numeral 21 designates a constant current source coupled between the output node 17 and the low voltage line LL. Another sample-and-hold circuit similar in circuit arrangement to that illustrated in FIG. 1 is disclosed by Robert A. Blauschild in "An 8b 50ns Monolithic A/D Converter with Internal S/H", 1983 IEEE International Solid-State Circuit Conference, pages 178 and 179.

However, a problem is encountered in the prior-art sample-and-hold circuits in driftage of the voltage level Vout at the output node 17. Namely, a decay tendency or the droop characteristic takes place in the voltage level Vout at the output node 17. This is because of the fact that the base currents $I_B$ are supplied from the hold-capacitor 15 having a capacitance Ch to the n-p-n type bipolar transistors 18 and 16 coupled to the hold-capacitor 15, which results in that the output signal Sout is gradually decreased in voltage level at a ratio of $I_B$/Ch. When the sample-and-hold circuit is designed to execute a high-speed operation, the component transistors are enlarged in size to have large current driving capabilities, so that the amount of the base currents $I_B$ are increased. When the base currents $I_B$ are increased, the driftage tendency is also increased in accordance with the above ratio. This results in serious driftage tendency. As a result, the sample-and-hold circuit seems to lose the hold function.

One of the solutions is to replace the bipolar transistors coupled to the hold-capacitor 15 to field effect type transistors so as to decrease the base currents $I_B$, or alternatively to the transistors with a large current amplification factor, which results in decreasing the base currents $I_B$ without enlargement of the transistor sizes. However, this solution needs to employ additional process dedicated to fabrication of those special transistors, and, for this reason, the fabrication process tends to be complicated. As a result, the solution is not feasible for a sample-and-hold circuit fabricated on a semiconductor substrate.

Another solution is to employ a darlington pair instead of the transistor coupled to the hold-capacitance 15 or to add a current compensation circuit. However, these sample-and-hold circuits can not respond to a high frequency input signal Sin, and, for this reason, the solution is not suitable for a high speed operation.

SUMMARY OF THE INVENTION

It is therefore an important object of the present invention to provide a sample-and-hold circuit which can respond to a high frequency input signal without deterioration in holding characteristics.

It is another important object of the present invention to provide a sample-and-hold circuit which can be implemented on a semiconductor substrate without additional process.

To accomplish these objects, the present invention proposes to provide voltage clamping means operative to cause the second transistor to be turned off.

In accordance with the present invention, there is provided a sample-and-hold circuit having a sample mode and a hold mode comprising (a) first and second voltage lines capable of supplying voltage levels different from each other, (b) a signal input node where an input signal is supplied in the sample mode, (c) a signal output node where an output signal is supplied, (d) first, second and third nodes, (e) a first transistor having a control node coupled to the signal input node and capable of providing a conduction path between the first voltage line and the first node in the sample mode, (f) a series combination of a first constant current source and a level shifting circuit coupled between the first voltage line and the first node, the second node being provided between the first constant current source and the level shifting circuit, (g) a second transistor having a control node coupled to the second node and capable of providing a conduction path between the first voltage line and the third node, (h) a hold-capacitor having two electrodes one of which is coupled to the third node and the other of which is coupled to a constant voltage source, said hold-capacitor being charged up to a certain voltage level in proportion to that of the input signal for production of the output signal, (i) second and third constant current sources each having an output node coupled to the second voltage line, (j) a first switching circuit responsive to a control signal and capable of providing a conduction path between the first node and the second constant current source in the sample mode, the first switching circuit being capable of providing a conduction path between the second node and the second constant current source in the hold mode, (k) a second switching circuit responsive to the control signal and capable of providing a conduction path between the third node and the third constant current source, the second switching circuit being capable of providing a conduction path between the first voltage line and the third constant current source, and (l) voltage clamping means operative to cause the second node to have a predetermined voltage level at which the second transistor blocks the conduction path between the first voltage line and the third node in so far as the hold-capacitor keeps the certain voltage level. The sample-and-hold circuit may comprise a third transistor having a control node coupled to the third node and capable of providing a conduction path between the first voltage line and the signal output node and a load current source coupled to the signal output node. In one implementation, the voltage clamping means may comprise a diode and a constant voltage source, and, in another implementation, the voltage clamping means may comprise a diode coupled between the first node and the second node. The level shifting circuit may comprise a a series of diodes, and all of the diodes forming the voltage clamping means and the level shifting circuit may be formed by n-p-n type bipolar transistors, respectively. The first switching circuit may comprise two n-p-n type bipolar transistors alternatively shifting between an on-state and off-state, and the second switching circuit may comprise two n-p-n type bipolar transistors alternatively shifting between an on-state and an off-state. Each of the first, second and third transistors may be formed by an n-p-n type bipolar transistor, and all of the n-p-n type bipolar transistors may have respective forwardly biassing voltages approximately equal to one another.

BRIEF DESCRIPTION OF THE DRAWINGS

The features and advantages of a sample-and-hold circuit according to the present invention will be more clearly understood from the following description taken in conjunction with the accompanying drawings in which.

DESCRIPTION OF THE PREFERRED EMBODIMENT

First Embodiment

Figure 2:
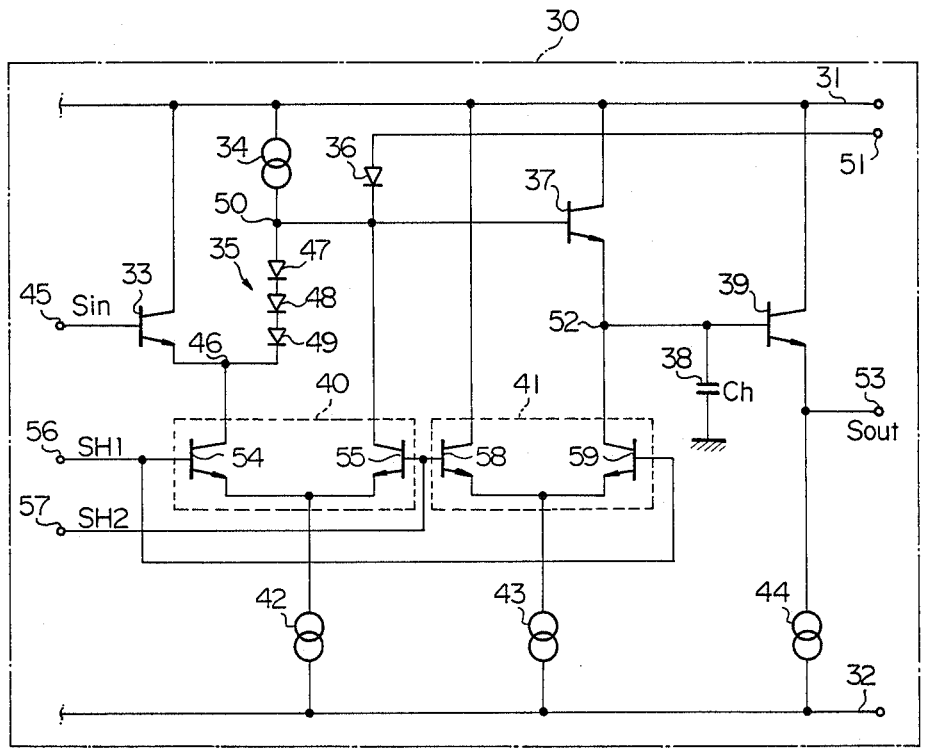
FIG. 2 is a circuit diagram showing the circuit arrangement of a sample-and-hold circuit embodying the present invention.

Referring first to FIG. 2 of the drawings, there is shown the circuit arrangement of a sample-and-hold circuit fabricated on a single semiconductor substrate 30. The sample-and-hold circuit illustrated in FIG. 2 is provided between a high voltage line 31 and a low voltage line 32 and largely comprises a first n-p-n type bipolar transistor 33, a series combination of a constant current source 34 and a level shifting circuit 35, a diode 36, a second n-p-n type bipolar transistor 37, a hold-capacitor 38, a third n-p-n type bipolar transistor 39, a first switching circuit 40, a second switching circuit 41, and three constant current sources 42, 43 and 44.

In detail, the first n-p-n type bipolar transistor 33 has a base node coupled to an input node 45 where an input signal Sin is supplied from the outside thereof, and the input signal Sin swings its voltage level between about 0 volt and about −2 volts. The n-p-n type bipolar transistor 33 thus arranged turns on when a predetermined forwardly biassing voltage Vbe33 is applied between the base node and the emitter node thereof. In this instance, the level shifting circuit 35 is formed by a series of diodes 47, 48 and 49 coupled between a first node 46 and a second node 50, and each of the diodes 47, 48 and 49 has a diode forward voltage Vd, so that a difference voltage equal to the diode forward voltage Vd takes place between the anode and the cathode of each diode 47, 48 or 49. The diode 36 has the anode coupled to a constant voltage source 51 producing a constant voltage Vcn and the cathode coupled to the second node 50. In this instance, the diode 36 has a diode forward voltage approximately equal to the diode forward voltage Vd of each diode 47, 48 or 49. The n-p-n type vipolar transistor 37 has a base node coupled to the second node 50, and a conduction path takes place between the collector node and the emitter node thereof when a predetermined forwardly biassing voltage Vbe37 is applied between the base-emitter junction thereof. The collector node of the n-p-n type bipolar transistor 37 is coupled to the high voltage line 31 and the emitter node is electrically connected to a third node 52. The hold-capacitor 38 has two electrodes one of which is coupled to the third node 52 and the other of which is grounded. The n-p-n type bipolar transistor 39 has the base node coupled to the third node 52 and serves as an emitter follower, so that an output signal Sout takes place at an output node 53 coupled to the emitter node of the n-p-n type bipolar transistor 39 upon application of a predetermined forwardly biassing voltage Vbe39 between the base-emitter junction thereof. In this instance, the diode forward voltage Vd is selected to be approximately equal to the predetermined forward biassing voltages Vbe33, Vbe37 and Vbe39 and has a value ranging between about 0.7 volt and 0.8 volt. Then, the constant voltage Vcn is selected in such a manner as to be lower than the voltage level Vin by a voltage value larger than three times the diode forward voltage 3Vd. In this instance, the input signal Sin swings its voltage level between about 9 volt to about −2 volts and the diode forward voltage Vd is between about 0.7 volt and 0.8 volt, so that the constant voltage level Vcn may be selected to be about zero volt.

The first switching circuit 40 is provided with two n-p-n type bipolar transistors 54 and 55, and the base nodes of the n-p-n type bipolar transistors 54 and 55 are coupled to control nodes 56 and 57, respectively, where a control signal SH1 and the complementary control signal SH2 respectively appear. The complementary control signal SH2 is different in phase from the control signal SH1 by 180 degrees. The collector nodes of the n-p-n type vipolar transistors 54 and 55 serves as input nodes of the first switching circuit 40 and are coupled in parallel to the first and second nodes 46 and 50, respectively. However, the emitter nodes of the n-p-n type bipolar transistors 54 and 55 are commonly coupled to the input node of the constant current source 42, and the output node of the constant current source 42 is coupled to the low voltage line 32. On the other hand, the second switching circuit 41 is provided with two n-p-n type bipolar transistors 58 and 59, and the base nodes of the n-p-n type bipolar transistors 58 and 59 are coupled in parallel to the control nodes 56 and 57. The emitter nodes of the n-p-n type bipolar transistors 58 and 59 also serve as input nodes of the second switching circuit 41 which are coupled to the high voltage line 31 and the third node 52, respectively, and the emitter nodes are commonly coupled to the input node of the constant current source 43. The output node of the constant current source 43 is electrically connected to the low voltage line 32. The constant current source 44 has the input node coupled to the output node 53, and the output node of the constant current source 44 is electrically connected to the low voltage line 32.

In a modification, the constant voltage source 51 may be formed by a diode or a series of diodes coupled between the high voltage line 31 and the anode of the diode 36.

In operations, when the control signal SH1 is in the high voltage level VH, the n-p-n type bipolar transistors 54 and 59 turn on to provide the conduction paths between the first node 46 and the constant current source 42 and between the third node 52 and the constant current source 43, respectively, however the n-p-n type bipolar transistors 55 and 58 are turned off, thereby allowing the sample-and-hold circuit to operate in a sample mode. In the same mode, when the input signal Sin is applied to the input node 45, the n-p-n type bipolar transistor 33 turns on to provide the conduction path between the high voltage line 31 and the first node 46, and the level-shifting circuit 35 also supplies the current from the constant current source 34 to the first node 46. The two current flows are merged with each other at the first node 46, so that the emitter node of the n-p-n type bipolar transistor 33 is approximately equal in voltage level to the cathode of the diode 49. Then, the voltage level $V_{50}$ of the second node 50 is given by Equation 4:

$$V_{50} = Vin - Vbe33 + 3Vd = Vin + 2Vd \qquad \text{(Eq. 4)}$$

when Vin is the voltage level of the input signal Sin. With the voltage level $V_{50}$, the n-p-n type bipolar transistor 37 turns on to charge up the hold-capacitor 38. Then, the hold-capacitor 15 is finally charged up to a voltage level Vc38 which is given by Equation 5:

$$Vc38 = Vin + 2Vd - Vbe37 = Vin + Vd \qquad \text{(Eq. 5)}$$

As will be understood from Equation 5, the voltage level Vc38 at the hold-capacitor 15 follows the voltage level Vin of the input signal Sin. In other words, the voltage level Vc38 is proportional to the voltage level Vin of the input signal Sin. The third node 52 is coupled to the base node of the n-p-n type bipolar transistor 38, so that the voltage level Vout is calculated as:

$$Vout = Vin + Vd - Vbe39 = Vin \qquad \text{(Eq. 6)}$$

From Equation 6, it is understood that the voltage level Vout is approximately equal to the voltage level of the input signal Vin.

On the other hand, when the control signal SH1 goes down to the low voltage level VL, the complementary control signal SH2 goes up to the high voltage level VH, thereby causing the n-p-n type bipolar transistors 55 and 58 to turn on to provide the respective conduction paths between the second node 50 and the constant current source 42 and between the high voltage line 31 and the constant current source 43, respectively. However, with the control signal SH1 of the low voltage level, the n-p-n type bipolar transistors 54 and 59 respectively turned off to block the conduction paths between the first node 46 and the constant current source 42 and between the third node 52 and the constant current source 43, respectively, so that the voltage level at the second node 50 is decreased, and, for this reason, the n-p-n type bipolar transistor 37 turns off, thereby completing the accumulation of the hold-capacitor 38. Upon completion of the sample mode, the hold-capacitor 38 keeps the voltage level higher than the voltage level Vin by the diode forward voltage Vd. On the other hand, the second node 50 and, accordingly, the base node of the n-p-n type bipolar transistor 37, is clamped at the voltage level lower than the constant voltage level Vcn by the diode forward voltage Vd. The constant voltage level Vcn is selected to be lower than the voltage level Vin by the voltage value larger than three times the diode forward voltage 3Vd. Then, the n-p-n type bipolar transistor 37 is kept in the off-state.

Figure 1:
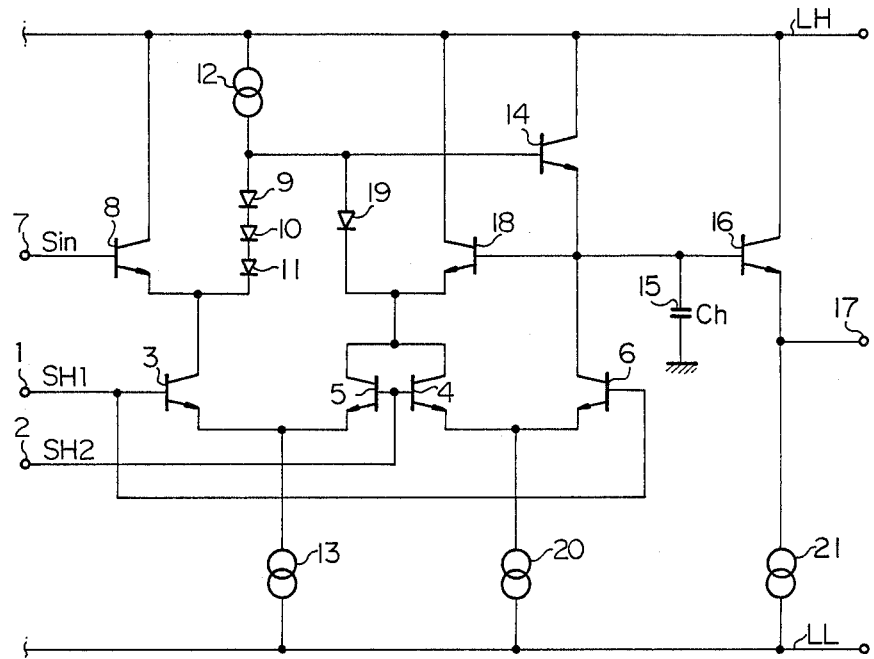
FIG. 1 is a circuit diagram showing a typical example of the sample-and-hold circuit.

The current flowing into the n-p-n type bipolar transistor 55 is supplied from not only the constant current source 34 but also the constant voltage source 51 through the diode 36, and the current flowing into the n-p-n type bipolar transistor 58 is directly supplied from the high voltage line 31. Assuming now that leakage currents of the n-p-n type bipolar transistor 39 and the hold-capacitor 38 are negligible, the driftage ratio (dVout/dt) of the output signal Sout is given by Equation 7:

$$(dVout/dt) = (I44/h_{FE})/Ch \qquad (Eq. 7)$$

where I44 is the amount of current flowing from the constant current source 44 and $h_{FE}$ is the current gain of the n-p-n type bipolar transistor 39. For better understanding, let's calculate the driftage ratio (dVout/dt) of the prior-art sample-and-hold circuit illustrated in FIG. 1 on the assumption that each of the n-p-n type bipolar transistors 16 and 18 has the current gains $h_{FE}$:

$$(dVout/dt) = [(I13 - I12 + I20 + I21)/h_{FE}]/Ch \qquad (Eq. 8)$$

where I12, I13, I20 and I21 are the amounts of currents respectively flowing from the constant current sources 12, 13, 20 and 21. If each of the amounts of currents I13, I20 and I21 is approximately equal to the amount of current I144 is twice as much as the amount of current I12, the driftage ratio (dVout/dt) of the prior-art sample-and-hold circuit is calculated as:

$$(dVout/dt) = 5(I12/h_{FE})/Ch \qquad (Eq. 9)$$

On the other hand, the driftage rate of the sample-and-hold circuit illustrated in FIG. 2 is given by Equation 10:

$$(dVout/dt) = 2(I12/h_{FE})/Ch \qquad (Eq. 10)$$

Comparing Equation 10 with Equation 9, it will be understood that the driftage ratio of the sample-and-hold circuit illustrated in FIG. 2 is two-fifth of the driftage ratio of the prior-art sample-and-hold circuit.

Second Embodiment

Figure 3:
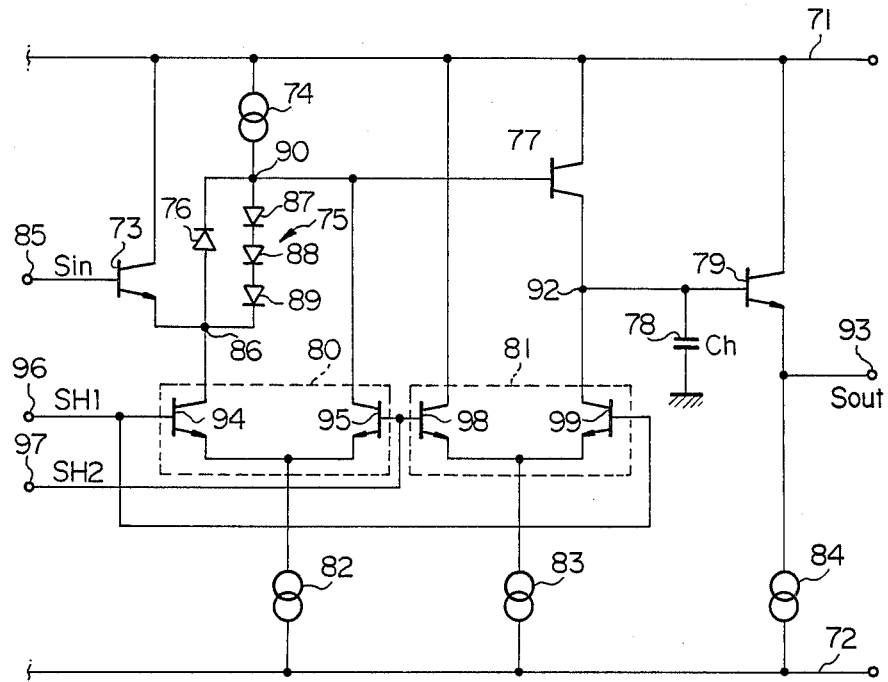
FIG. 3 is a circuit diagram showing the circuit arrangement of another sample-and-hold circuit embodying the present invention.

Turning to FIG. 3 of the drawings, the circuit arrangement of another sample-and-hold circuit according to the present invention is illustrated and formed between a high voltage line 71 and a low voltage line 72. The sample-and-hold circuit illustrated in FIG. 3 largely comprises a first n-p-n type bipolar transistor 73, a series combination of a constant current source 74 and a level shifting circuit 75, a diode 76, a second n-p-n type bipolar transistor 77, a hold-capacitor 78, a third n-p-n type bipolar transistor 79, a first switching circuit 80, a second switching circuit 81, and three constant current sources 82, 83 and 84.

In detail, the first n-p-n type bipolar transistor 73 has a base node coupled to an input node 85 where an input signal Sin is supplied from the outside thereof, and the input signal Sin swings its voltage level between high and low voltage levels. The n-p-n type bipolar transistor 73 thus arranged turns on when a predetermined forwardly biassing voltage Vbe73 is applied between the base node and the emitter node thereof. In this instance, the level shifting circuit 75 is formed by a series of diodes 87, 88 and 89 coupled between a first node 86 and a second node 90, and each of the diodes 87, 88 and 89 has a diode forward voltage Vd, so that a difference voltage equal to the diode forward voltage Vd takes place between the anode and the cathode of each diode 87, 88 or 89. The diode 76 has the anode coupled to the first node 86 and the cathode coupled to the second node 90. In this instance, the diode 76 has a diode forward voltage approximately equal to the diode forward voltage Vd of each diode 87, 88 or 89. The n-p-n type bipolar transistor 77 has the base node coupled to the second node 90, and a conduction path takes place between the collector node and the emitter node thereof when a predetermined forwardly biassing voltage Vbe77 is applied between the base-emitter junction thereof. The collector node of the n-p-n type bipolar transistor 77 is coupled to the high voltage line 71 and the emitter node is electrically connected to a third node 92. The hold-capacitor 78 has two electrodes one of which is coupled to the third node 92 and the other of which is grounded. The n-p-n type bipolar transistor 79 has the base node coupled to the third node 92 and serves as an emitter follower, so that an output signal Sout takes place at an output node 93 coupled to the emitter node of the n-p-n type bipolar transistor 79 upon application of a predetermined forwardly biassing voltage Vbe 79 between the base-emitter junction thereof. In this instance, the diode forward voltage Vd is selected to be approximately equal to the predetermined forward biassing voltages Vbe73, Vbe77 and Vbe79.

The first switching circuit 80 is provided with two n-p-n type bipolar transistors 94 and 95, and the base nodes of the n-p-n type bipolar transistors 94 and 95 are coupled to control nodes 96 and 97, respectively, where a control signal SH1 and the complementary control signal SH2 respectively appear. The complementary control signal SH2 is different in phase from the control signal SH1 by 180 degrees. The collector nodes of the n-p-n type bipolar transistors 94 and 95 serves as input nodes of the first switching circuit 80 and are coupled in parallel to the first and second nodes 96 and 90, respectively. However, the emitter nodes of the n-p-n type bipolar transistors 94 and 95 are commonly coupled to the input node of the constant current source 82, and the output node of the constant current source 82 is coupled to the low voltage line 72. On the other hand, the second switching circuit 81 is provided with two n-p-n type bipolar transistors 98 and 99, and the base nodes of the n-p-n type bipolar transistors 98 and 99 are coupled in parallel to the control nodes 96 and 97. The emitter nodes of the n-p-n type bipolar transistors 98 and 99 also serve as input nodes of the second switching circuit 81 which are coupled to the high voltage line 71 and the third node 92, respectively, and the emitter nodes are commonly coupled to the input node of the constant current source 83. The output node of the constant current source 83 is electrically connected to the low voltage line 72. The constant current source 84 has the input node coupled to the output node 93, and the output node of the constant current source 84 is electrically connected to the low voltage line 72.

The sample-and-hold circuit thus arranged is similar in operation to the first embodiment. Then, detailed description for the sample mode is not incorporated for the sake of simplicity. In the hold mode, the second node 90 and, accordingly, the base node of the n-p-n type bipolar transistor 77 is clamped at the voltage level lower than that of the first node 86 by the agency of the diode 76. Then, the n-p-n type bipolar transistor 77 is kept in the off-state.

The current flowing into the n-p-n type bipolar transistor 95 is supplied from not only the constant current source 74, and the current flowing into the n-p-n type bipolar transistor 98 is directly supplied from the high voltage line 71. Assuming now that leakage currents of the n-p-n type bipolar transistor 79 and the hold-capacitor 78 are negligible, the driftage ratio (dVout/dt) of the output signal Sout is given by Equation 11:

$$(dVout/dt) = (I84/h_{FE})/Ch \qquad \text{(Eq. 11)}$$

where I84 is the amount of current flowing from the constant current source 84 and $h_{FE}$ is the current gain of the n-p-n type bipolar transistor 79. Using the same relationships among the currents I12, I13, I20, I21 and I84, we get:

$$(dVout/dt) = 2(I12/h_{FE})/Ch \qquad \text{(Eq. 12)}$$

Comparing Equation 12 with Equation 9, it will be understood that the driftage ratio of the sample-and-hold circuit illustrated in FIG. 3 is two fifth of the driftage ratio of the prior-art sample-and-hold circuit.

As will be understood from the foregoing description, it is understood that the sample-and-hold circuit according to the present invention is improved in driftage of voltage at the output node without using any special transistor and that the sample-and-hold circuit is capable of carrying out a high speed operation because no special circuit arrangement such as a current compensation circuit is employed therein.

In another implementation, each of the diodes 47, 48, 49 and 36 is formed by a bipolar transistor having the base node coupled to the collector node.

Although particular embodiment of the present invention have been shown and described, it will be obvious to those skilled in the art that various changes and modifications may be made without departing from the spirit and scope of the present invention.

What is claimed is:

1. A sample-and-hold circuit having a sample mode and a hold mode, comprising:

(a) first and second voltage lines capable of supplying voltage levels different from each other;

(b) a signal input node where an input signal is supplied in said sample mode;

(c) a signal output node where an output signal is supplied;

(d) first, second and third nodes;

(e) a first transistor having a control node coupled to said signal input node and capable of providing a conduction path between said first voltage line and said first node in said sample mode;

(f) a series combination of a first constant current source and a level shifting circuit coupled between said first voltage line and said first node, said second node being provided between said first constant current source and said level shifting circuit;

(g) a second transistor having a control node coupled to said second node and a capable of providing a conduction path between said first voltage line and said third node;

(h) a hold-capacitor having two electrodes one of which is coupled to said third node and the other of which is coupled to a constant voltage source, said hold-capacitor being charged up to a certain voltage level in proportion to a voltage level of said input signal for producing said output signal;

(i) second and third constant current sources each having an output node coupled to said second voltage line;

(j) a first switching circuit responsive to a control signal and capable of providing a conductive path between said first node and said second constant current source in said sample mode, said first switching circuit being capable of providing a conduction path between said second node and said second constant current source in said hold mode;

(k) a second switching circuit responsive to said control signal and capable of providing a conduction path between said third node and said third constant current source, said second switching circuit being capable of providing a conduction path between said first voltage line and said third constant current source; and (l) voltage clamping means operative to cause said second node to have a predetermined voltage level at which said second transistor blocks said conduction path between said first voltage line and said third node in so far as said hold-capacitor keeps said certain voltage level.

2. A sample-and-hold circuit as set forth in claim 1, in which said sample-and-hold circuit further comprises a third transistor having a control node coupled to said third node and capable of providing a conduction path between said first voltage line and said signal output node, and a load current source coupled between said signal output node and said second voltage line.

3. A sample-and-hold circuit as set forth in claim 2, in which said voltage clamping means comprise a diode and a constant voltage source.

4. A sample-and-hold circuit as set forth in claim 3, in which said diode is formed by a fourth transistor having a control node coupled to one end of a conduction path formed therein.

5. A sample-and-hold circuit as set forth in claim 4, in which said first, second, third and fourth transistors are formed by n-p-n type bipolar transistors, respectively.

6. A sample-and-hold circuit as set forth in claim 2, in which said voltage clamping means comprise a diode coupled between said first node and said second node.

7. A sample-and-hold circuit as set forth in claim 6, in which said diode is formed by a fourth transistor having a control node coupled to one end of a conduction path formed therein.

8. A sample-and-hold circuit as set forth in claim 7, in which said first, second, third and fourth transistors are formed by n-p-n type bipolar transistors, respectively.

9. A sample-and-hold circuit as set forth in claim 5, in which said level shifting circuit comprises a series of diodes.

10. A sample-and-hold circuit as set forth in claim 9, in which each of said series of diode is formed by an n-p-n type bipolar transistor having a base node coupled to a collector node thereof.

11. A sample-and-hold circuit as set forth in claim 10, in which said first switching circuit comprises two n-p-n type bipolar transistors alternatively shifting between an on-state and an off-state, one of said n-p-n type bipolar transistors being capable of providing a conduction path between said first node and said second constant current source, the other of said n-p-n type bipolar transistors being capable of providing a conduction path between said second node and said second constant current source.

12. A sample-and-hold circuit as set forth in claim 11, in which said second switching circuit comprises two n-p-n type bipolar transistor alternatively shifting between an on-state and an off-state, one of said n-p-n type bipolar transistors being capable of providing a conduction path between said third node and said third constant current course, the other of said n-p-n type bipolar transistors being capable of providing a conduction path between said first voltage line and said third constant current source.

13. A sample-and-hold circuit as set forth in claim 12, in which all of said n-p-n type bipolar transistors have respective forwardly biassing voltage approximately equal to one another.

14. A sample-and-hold circuit as set forth in claim 8, in which said level shifting circuit comprises a series of diodes.

15. A sample-and-hold circuit as set forth in claim 14, in which each of said series of diode is formed by an n-p-n type bipolar transistor having a base node coupled to a collector node thereof.

16. A sample-and-hold circuit as set forth in claim 15, in which said first switching circuit comprises two n-p-n type bipolar transistors alternatively shifting between an on-state and an off-state, one of said n-p-n type bipolar transistors being capable of providing a conduction path between said first node and said second constant current source, the other of said n-p-n type bipolar transistors being capable of providing a conduction path between said second node and said second constant current source.

17. A sample-and-hold circuit as set forth in claim 16, in which said second switching circuit comprises two n-p-n type bipolar transistors alternatively shfiting between an on-state and an off-state, one of said n-p-n type bipolar transistors being capable of providing a conduction path between said third node and said third constant current source, the other of said n-p-n type bipolar transistors being capable of providing a conduction path between said first voltage line and said third constant current source.

18. A sample-and-hold circuit as set forth in claim 17, in which all of said n-p-n type bipolar transistors have respective forwardly biassing voltage approximately equal to one another.

* * * * *